United States Patent
Li et al.

(10) Patent No.: US 9,024,708 B2
(45) Date of Patent: May 5, 2015

(54) MICROMECHANICAL RESONATOR OSCILLATOR STRUCTURE AND DRIVING METHOD THEREOF

(75) Inventors: Sheng-Shian Li, Taoyuan County (TW); Li-Jen Hou, Taipei (TW); Cheng-Syun Li, Hsinchu (TW)

(73) Assignee: National Tsing Hua University, Hsinchu (TW)

(*) Notice: Subject to any disclaimer, the term of this patent is extended or adjusted under 35 U.S.C. 154(b) by 383 days.

(21) Appl. No.: 13/615,609

(22) Filed: Sep. 14, 2012

(65) Prior Publication Data
US 2014/0002200 A1 Jan. 2, 2014

(30) Foreign Application Priority Data
Jun. 28, 2012 (TW) .............................. 101123301 A (51) Int. Cl.
| | | |
|---|---|---|
| H03B 5/30 | (2006.01) | |
| H03H 9/24 | (2006.01) | |
| H03B 5/36 | (2006.01) | |
| H03H 9/02 | (2006.01) | |

(52) U.S. Cl.
CPC .............. H03B 5/36 (2013.01); H03H 9/02393 (2013.01); H03H 9/02259 (2013.01); H03H 9/2436 (2013.01); H03H 9/2463 (2013.01); H03H 2009/02511 (2013.01); H03H 2009/2442 (2013.01)

(58) Field of Classification Search
CPC .......... H03H 9/02244; H03H 9/02259; H03H 9/02393; H03H 9/02409; H03H 9/2436; H03H 9/2463; H03H 9/2447; H03H 2009/02251; H03H 2009/02291; H03H 2009/02511; H03H 2009/2442; H03B 5/30; H03B 5/36

USPC .................................. 333/186, 197, 199, 200
See application file for complete search history.

(56) References Cited

U.S. PATENT DOCUMENTS

| | | | |
|---|---|---|---|
| 5,976,994 A | 11/1999 | Nguyen et al. | |
| 6,249,073 B1 | 6/2001 | Nguyen et al. | |

(Continued)

FOREIGN PATENT DOCUMENTS

| | | |
|---|---|---|
| TW | 570420 U | 1/2004 |
| TW | I283739 B | 7/2007 |

(Continued)

OTHER PUBLICATIONS

Wu et al.; "Integrated Gm-C Based PI Controller for MEMS Gyroscope Drive Loop"; 2011 IEEE 9th International Conference on ASIC (ASICON), Oct. 25-28, 2011, pp. 858-861 and 1 page of an IEEE Xplore abstract.*

(Continued)

*Primary Examiner* — Barbara Summons
(74) *Attorney, Agent, or Firm* — CKC & Partners Co., Ltd.

(57) ABSTRACT

This invention provides a micromechanical resonator oscillator structure and a driving method thereof. As power handling ability of a resonator is proportional to its equivalent stiffness, a better power handling capability is obtained by driving a micromechanical resonator oscillator at its high equivalent stiffness area. One of the embodiments of this invention is demonstrated by using a beam resonator. A 9.7-MHZ beam resonator via the high-equivalent stiffness area driven method shows better power handling capability and having lower phase noise.

11 Claims, 14 Drawing Sheets

(56) References Cited

U.S. PATENT DOCUMENTS

| | | |
|---|---|---|
| 6,424,074 B2 | 7/2002 | Nguyen |
| 6,642,067 B2 * | 11/2003 | Dwyer ............................ 438/17 |
| 6,741,137 B1 * | 5/2004 | Sibrai et al. .................... 331/109 |
| 6,930,569 B2 * | 8/2005 | Hsu ................................. 333/186 |
| 6,985,051 B2 * | 1/2006 | Nguyen et al. ................. 333/186 |
| 7,463,116 B2 * | 12/2008 | Naniwada ...................... 333/186 |
| 7,541,895 B2 * | 6/2009 | Tada et al. ...................... 333/186 |
| 7,612,484 B2 * | 11/2009 | Tripard et al. ................. 310/309 |
| 7,755,454 B2 * | 7/2010 | Tanaka et al. .................. 333/186 |
| 7,812,680 B1 * | 10/2010 | Brown et al. ................... 331/154 |
| 7,859,365 B2 * | 12/2010 | Ho et al. ......................... 333/186 |
| 8,686,802 B1 * | 4/2014 | Brown et al. ................... 331/154 |
| 2007/0046398 A1 * | 3/2007 | Nguyen et al. ................. 333/186 |
| 2012/0192647 A1 * | 8/2012 | Ayazi et al. ................... 73/504.12 |

FOREIGN PATENT DOCUMENTS

| | | |
|---|---|---|
| TW | I313501 B | 8/2009 |
| TW | 201121234 A | 6/2011 |
| TW | 201203401 A | 1/2012 |

OTHER PUBLICATIONS

L.-J. Hou, C.-S. Li, and S.-S. Li, "High-stiffness-driven micromechanical resonator oscillator with enhanced phase noise performance," Proceedings, 25th IEEE Int. Micro Electro Mechanical Systems Conf. (MEMS'12), Paris, France, Jan. 29-Feb. 2, 2012, pp. 700-703.

L.-J. Hou and S.-S. Li, "High-stiffness driven micromechanical resonators with enhanced power handling," Appl. Phys. Lett. 100, 131908 (2012).

* cited by examiner

MICROMECHANICAL RESONATOR OSCILLATOR STRUCTURE AND DRIVING METHOD THEREOF

RELATED APPLICATIONS

The application claims priority to Taiwan Application Serial Number 101123301, filed Jun. 28, 2012, which is herein incorporated by reference.

BACKGROUND

1. Field of Invention

The present invention relates to a micromechanical resonator oscillator structure and its driving method. More particularly, the present invention relates to a micromechanical resonator oscillator and its high equivalent stiffness driving method.

2. Description of Related Art

A quartz crystal oscillator is used for generating clock pluses and widely used in electronic products such as mobile phones, personal computers, digital cameras, electronic clocks and motherboards. However, a conventional quartz crystal oscillator has the disadvantages of being bulky, costly and difficult to be integrated with IC (Integrated Circuit). Recently, the developments of the micromechanical resonator oscillator get more focused. The advantages of the micromechanical resonator oscillator are low cost, small volume and high integration capability to the LSI (Large-Scale-Integrated Circuits). The anti-shock capability of the micromechanical resonator oscillator is also better than that of the Quartz crystal oscillator.

U.S. Pat. No. 6,249,073 discloses a micromechanical oscillator structure. The micromechanical oscillator structure comprises a beam oscillator and a supporting structure. The supporting structure supports the beam oscillator in order to form a gap, thus forming an oscillation. The micromechanical oscillator can obtain a high Q-value in a high frequency range. Besides, the working frequency can be expanded by a differential signal technique.

U.S. Pat. No. 6,958,566 discloses another mechanical oscillator related to phenomena of dependent electronic stiffness. The mechanical oscillator o comprises a substrate, a mechanical oscillator and a supporting structure. A gap is formed between the nearby electrode and the mechanical oscillator. By means of a controllable voltage between an electrode and the mechanical oscillator, improvement on the instability of the oscillating frequency caused by temperature and acceleration can be made.

Although the prior art discloses a micromechanical oscillator structure and a driving method thereof, yet an issued of high phase noise still remains unsolved.

SUMMARY

A micromechanical resonator oscillator structure and a driving method thereof are provided. The micromechanical resonator oscillator structure comprises a substrate, an insulating layer, a conductive layer, an oscillation unit and a plurality of anchor points. An insulating layer is deposited on the substrate. A conductive layer deposited on the insulating layer, and the conductive layer comprises an electrode set and an input contact. An oscillation unit has a high equivalent stiffness area and a low equivalent stiffness area. At least one of the anchor points connects the high equivalent stiffness area of the oscillation unit to the input contact, and the anchor points support the oscillation unit on the substrate.

A driving method applicable to the micro mechanical resonator oscillator structure comprises:

inputting an input electronic signal from a driving electrode of the micro mechanical resonator oscillator structure, and outputting an output electronic signal from a sensing electrode of the micro mechanical resonator oscillator structure, and passing the output electronic signal through a number of electronic components, It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follow

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1A:
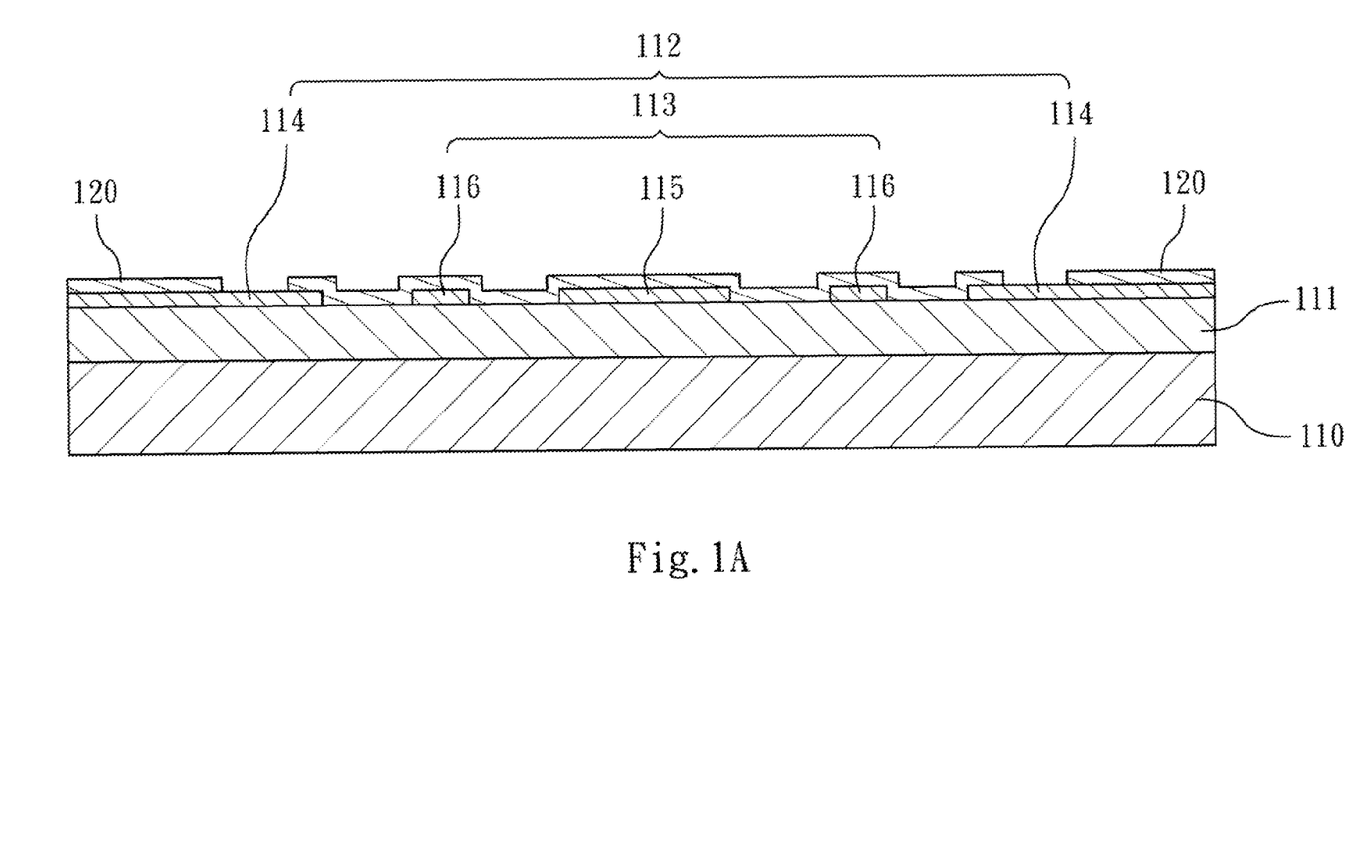
FIG. 1A is schematic view showing a first process step of the micromechanical resonator oscillator according to an embodiment of the present invention.

Referring to FIG. 1A, an insulating layer 111 is deposited on a substrate 110 for electric isolation. A conductive layer 112 is deposited on the insulating layer 111. Then, an electrode set 113 and an input point 114 are formed on the insulating layer 111 by a photolithography process. The electrode set 113 comprises one electrode 115 and the other electrode 116. Then, a sacrifice layer 120 is deposited on the conductive layer 112, A reactive ion etching method is applied for etching the sacrifice layer 120 to form an anchor point 117 in FIG. 1B.

Figure 1B:
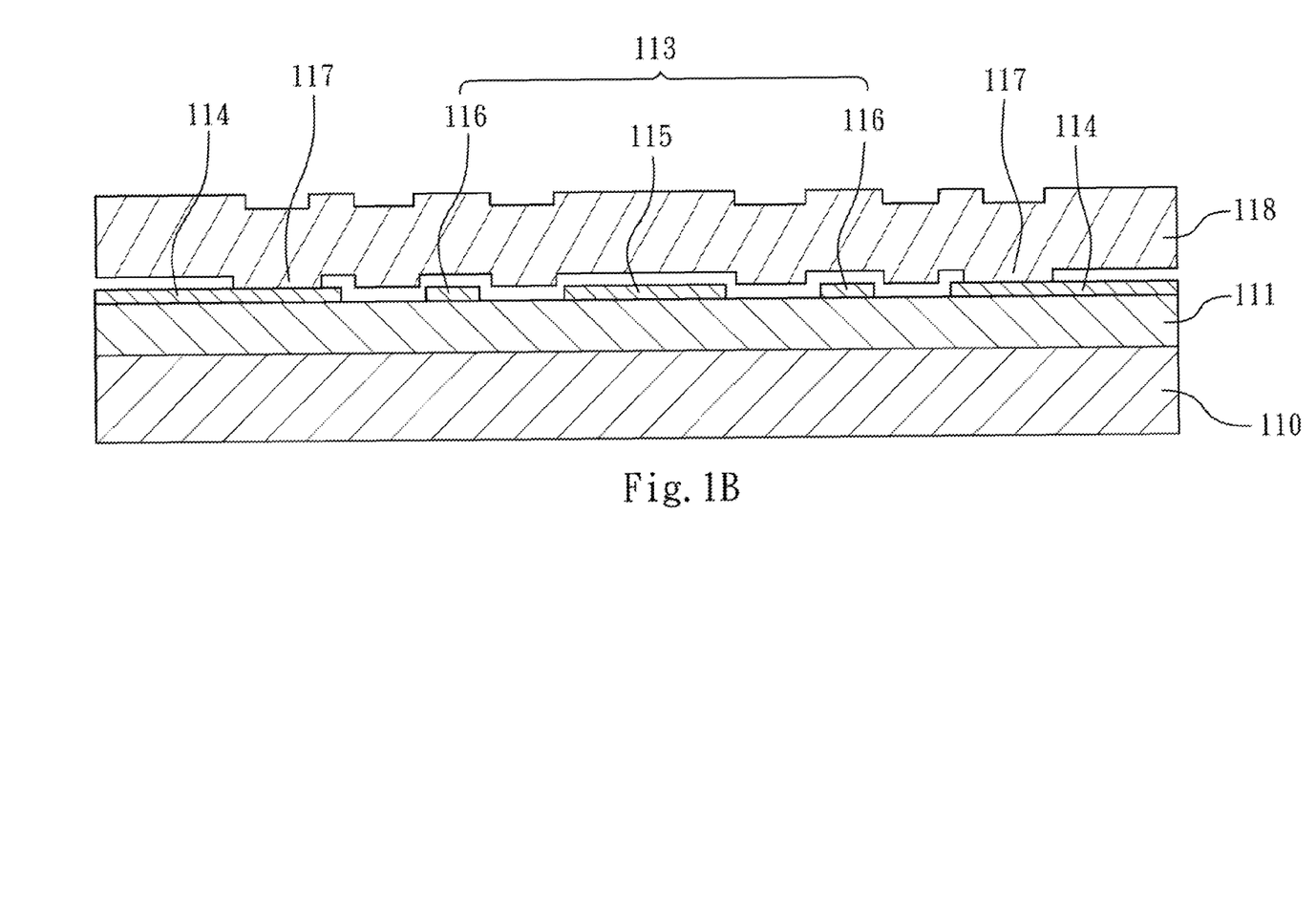
FIG. 1B is schematic view showing a second process step of the micromechanical resonator oscillator according to the embodiment of the present invention.

Referring to FIG. 1B, a structure layer 118 is deposited on the sacrifice layer 120. A main structure of an oscillation unit 119 is formed from a structure layer 118 by the photolithography process.

Figure 1C:
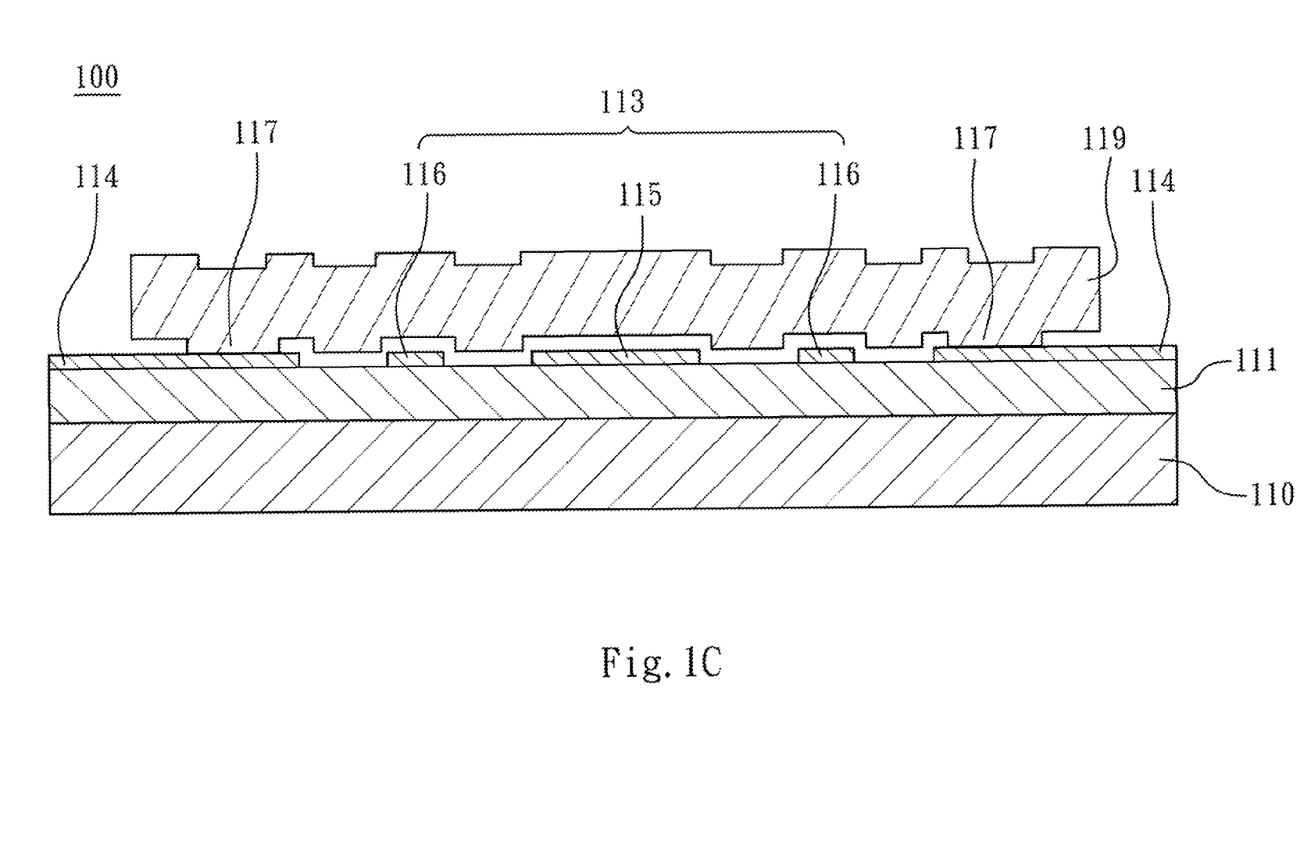
FIG. 1C is schematic view showing a third process step of the micromechanical resonator oscillator according to the embodiment of the present invention.

Referring to FIG. 1C, a complete micromechanical resonator oscillator is formed after the sacrifice layer 120 is removed by a chemical wet etching method.

Figure 2A:
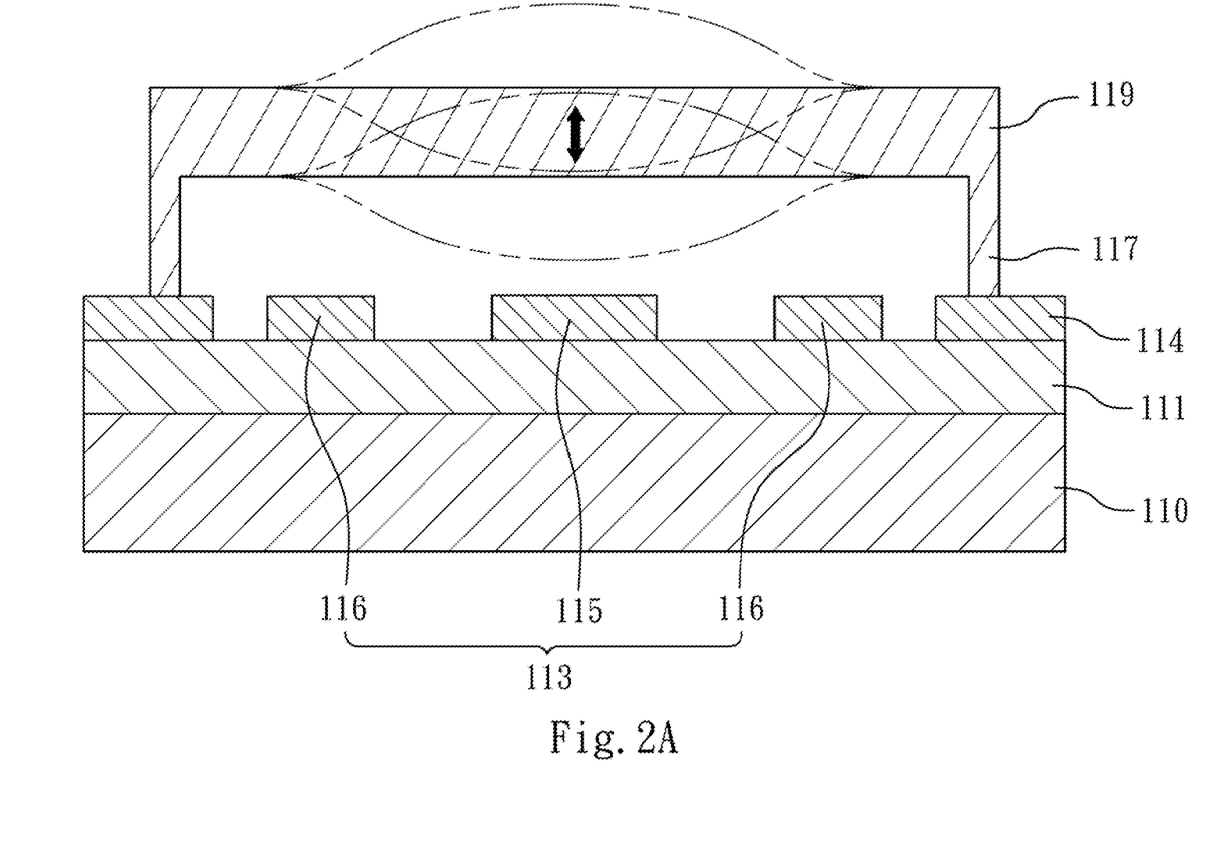
FIG. 2A is schematic view showing an oscillation unit being oscillated.

Referring to FIG. 2A, the oscillation unit 119 and the input point 114 are connected by the anchor point 117. The anchor point 117 supports the oscillation unit 119 and a gap is formed between the oscillation unit 119 and the electrode set 113, and thus an equivalent capacitance structure is formed.

Figure 2B:
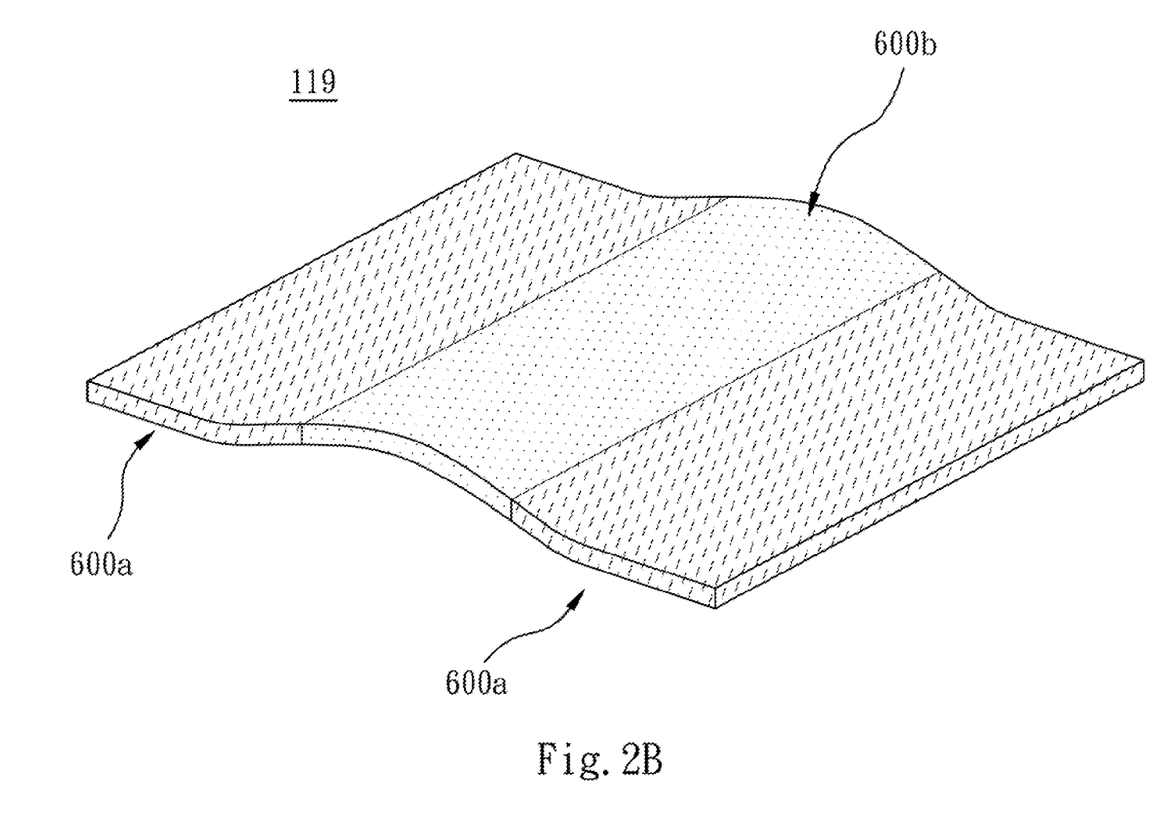
FIG. 2B is a schematic diagram showing the distribution of an equivalent stiffness area of the oscillation unit of the micromechanical resonator oscillator.

Referring to FIG. 2B, the distribution of the equivalent stiffness areas of the oscillation unit is formed by a theoretical calculation. The physical phenomena corresponding to the theoretically calculation can be explained by the following description. When the oscillation begins, both side areas of the oscillation unit 119 are connected to and supported at input points 114, and thus have lower oscillation speeds and higher equivalent stiffness. A central area of the oscillation unit 119 has a larger oscillation speed owing to the nature of the vibrating mode shape. When the oscillation speed is lower, the equivalent stiffness is higher. Therefore, the equivalent stiffness is lower in the central area of the oscillation unit 119 than that in the side areas of the oscillation unit 119. By applying a theoretical calculation, the high equivalent stiffness area 600a and the low equivalent stiffness area 600b can be defined.

Figure 3A:
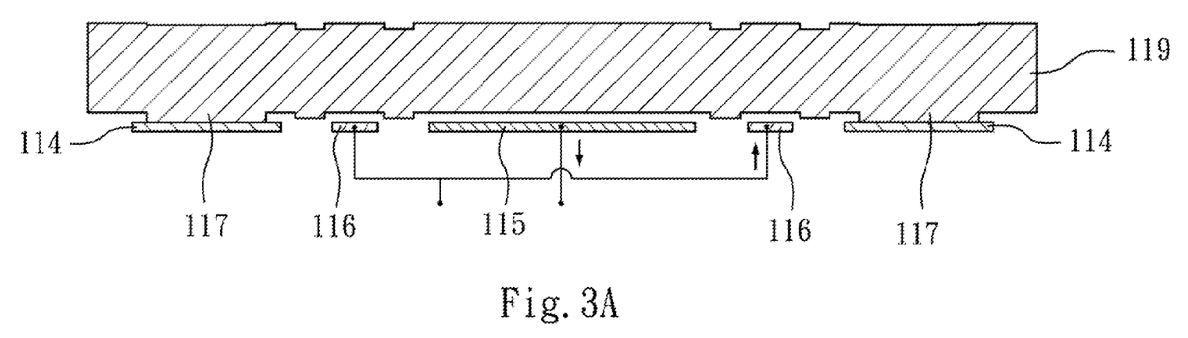
FIG. 3A is a schematic diagrams showing the layouts of an electrode set for a driving method of a high equivalent stiffness area of the oscillation unit of the micromechanical resonator oscillator.

Referring to FIG. 3A. an electrode 115 is placed under the low equivalent stiffness area, and an electrode 116 is placed under the high equivalent stiffness area. An electrical signal is inputted from the electrode 116 and outputted from the electrode 115. It is defined that the electrical signal is inputted from a driving electrode and outputted from a sensing electrode, 3A shows a driving method for the high equivalent stiffness area of the oscillation unit.

Figure 3B:
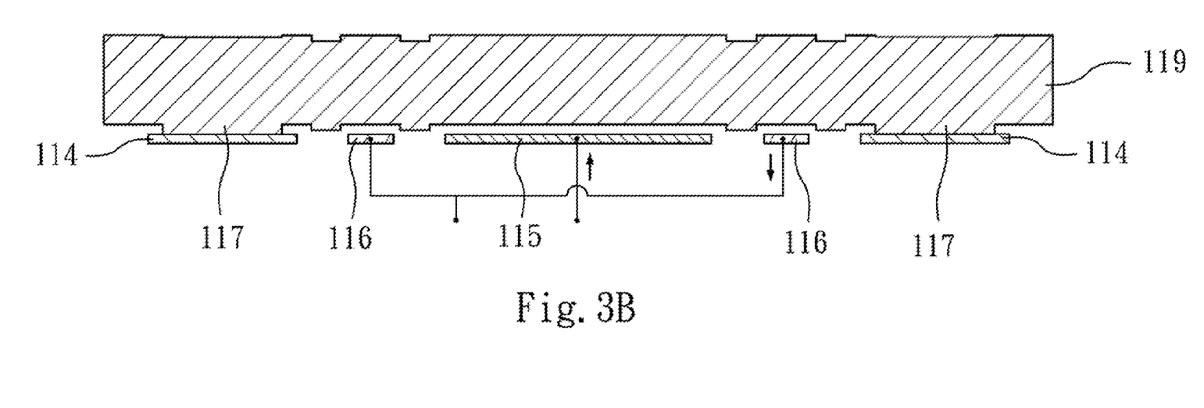
FIG. 3B is a schematic diagrams showing the layouts of an electrode set for a driving method of a low equivalent stiffness ea of the oscillation unit of the micromechanical resonator oscillator.

Referring to FIG. 3B, an electrode 115 is placed under the low equivalent stiffness area and an electrode 116 is placed under the high equivalent stiffness area. An electrical signal is inputted from the electrode 115 and is outputted from the electrode 116. It is defined that the electrical signal is inputted from a driving electrode and outputted from a sensing electrode. FIG. 3B shows a driving method for the low equivalent stiffness area of the oscillation unit.

Figure 4:
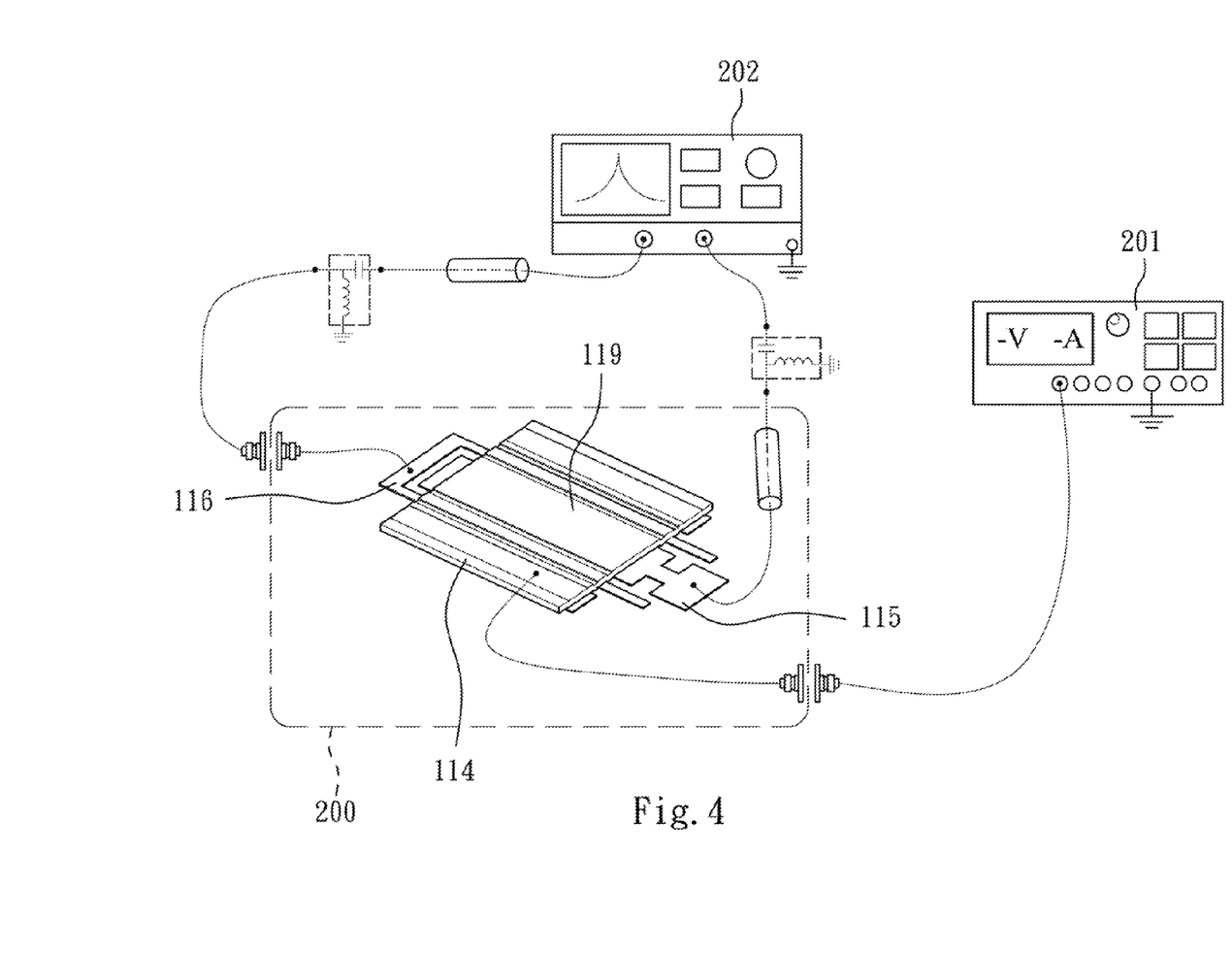
FIG. 4 shows a method for measuring an oscillation frequency spectrum of the micromechanical resonator oscillator.

Referring to FIG. 4, FIG. 4 shows a method for measuring an oscillation to frequency spectrum of the micromechanical resonator oscillator. A micromechanical resonator oscillator is placed in a vacuum chamber 200 for preventing air damping and noise interference. The vacuum chamber 200 has a connecting point. A power supply 201 is connected to the input point 114 of the micromechanical resonator oscillator 100 through the vacuum chamber 200. The power supply 201 provides an electrical signal in order to enlarge the oscillation and to tune the frequency of the oscillation unit 119. An output end of a network analyzer 202 is connected to an electrode of the micromechanical resonator oscillator 100, and an input end of the network analyzer 202 is connected to the other electrode of the micromechanical resonator oscillator 100.

Figure 5:
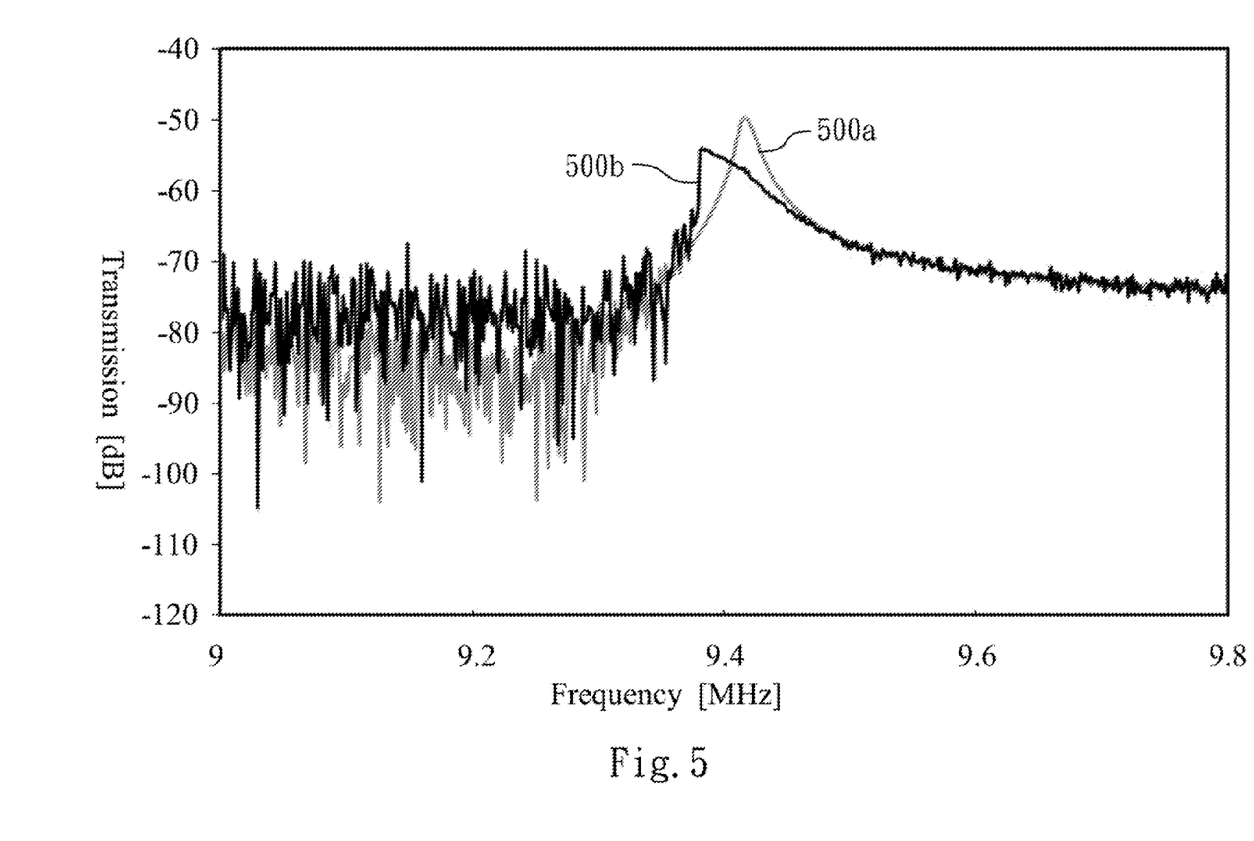
FIG. 5 shows a comparison of frequency spectra between the driving method of the high equivalent stiffness area and the driving method of the low equivalent stiffness area of the oscillation unit.

Referring to FIG. 5, FIG. 5 shows a comparison of frequency spectra between the driving method of the high equivalent stiffness area and the driving method of the low equivalent stiffness area of the oscillation unit 119. The measurement described in FIG. 4 is applied to the electrode layouts of signals are compared. It is found that the frequency spectrum 500a outputted by the driving method of the high equivalent stiffness area of the oscillation unit 119 is more stable than the frequency spectrum 500b outputted by the driving method of the low equivalent stiffness area of the oscillation unit 119.

Figure 6:
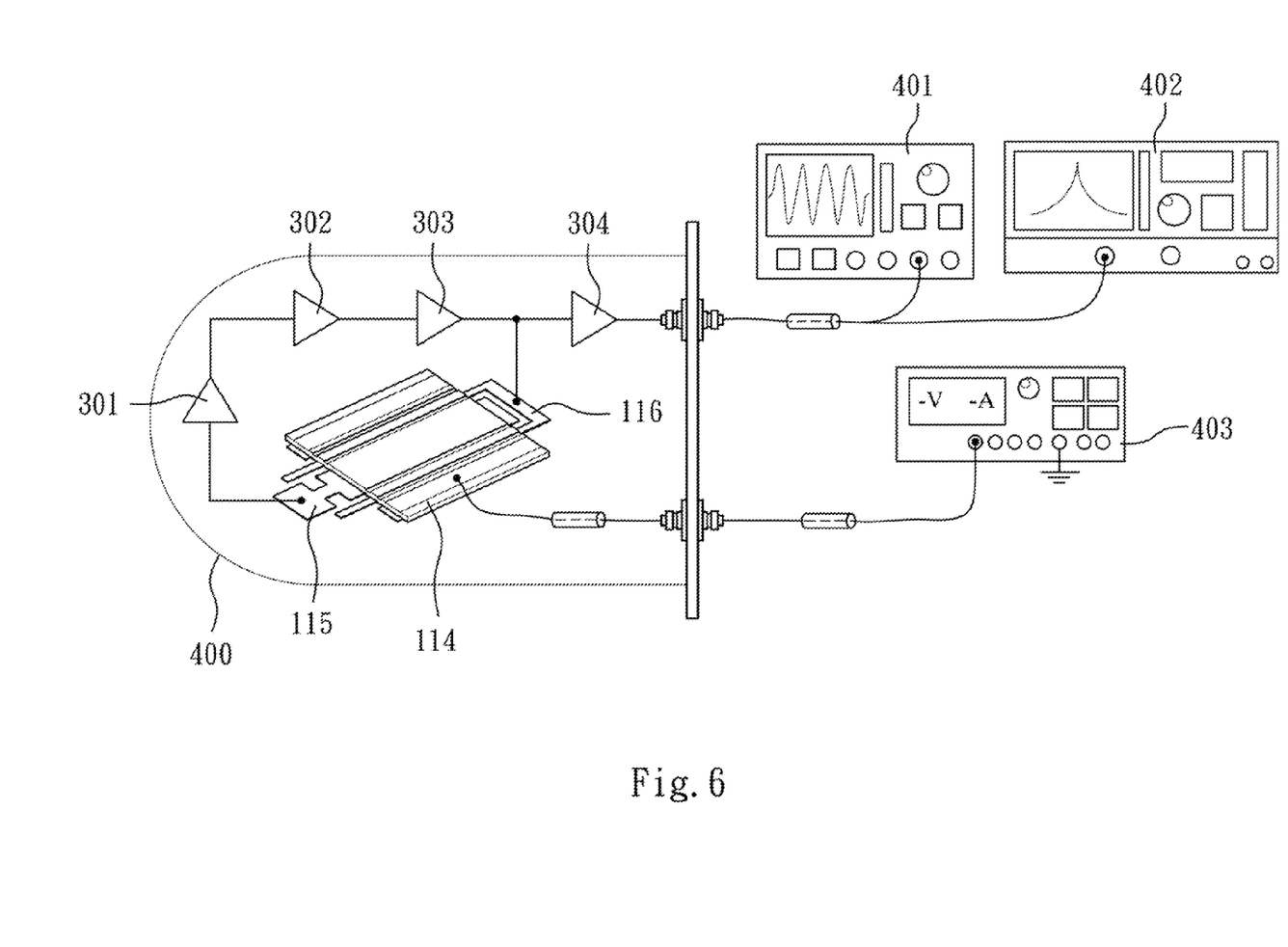
FIG. 6 shows a method for measuring a phase noise of the micromechanical resonator oscillator.

Referring to FIG. 6, FIG. 6 shows a method for measuring a phase noise of the micromechanical resonator oscillator. An electrical circuit (not labeled) is connected in series with the micromechanical resonator oscillator. The electrical circuit comprises a transimpedance amplifier 301, a variable-gain amplifier 302, a loop buffer 303 and an output buffer 304. A micromechanical resonator oscillator 100 is placed in a vacuum chamber 400 for preventing air damping and noise interference. The vacuum chamber 400 has a connecting point. A power supply 403 is connected to the input point 114 of the micromechanical resonator oscillator 100 through the vacuum chamber 400. The power supply 403 provides an electrical signal in order to enlarge the oscillation and to tune the frequency of the oscillation unit 119. An oscillation analyzer 401 and a frequency spectrum analyzer 402 are independently connected to the output buffer 304 in order to measure the output signal.

Figure 7:
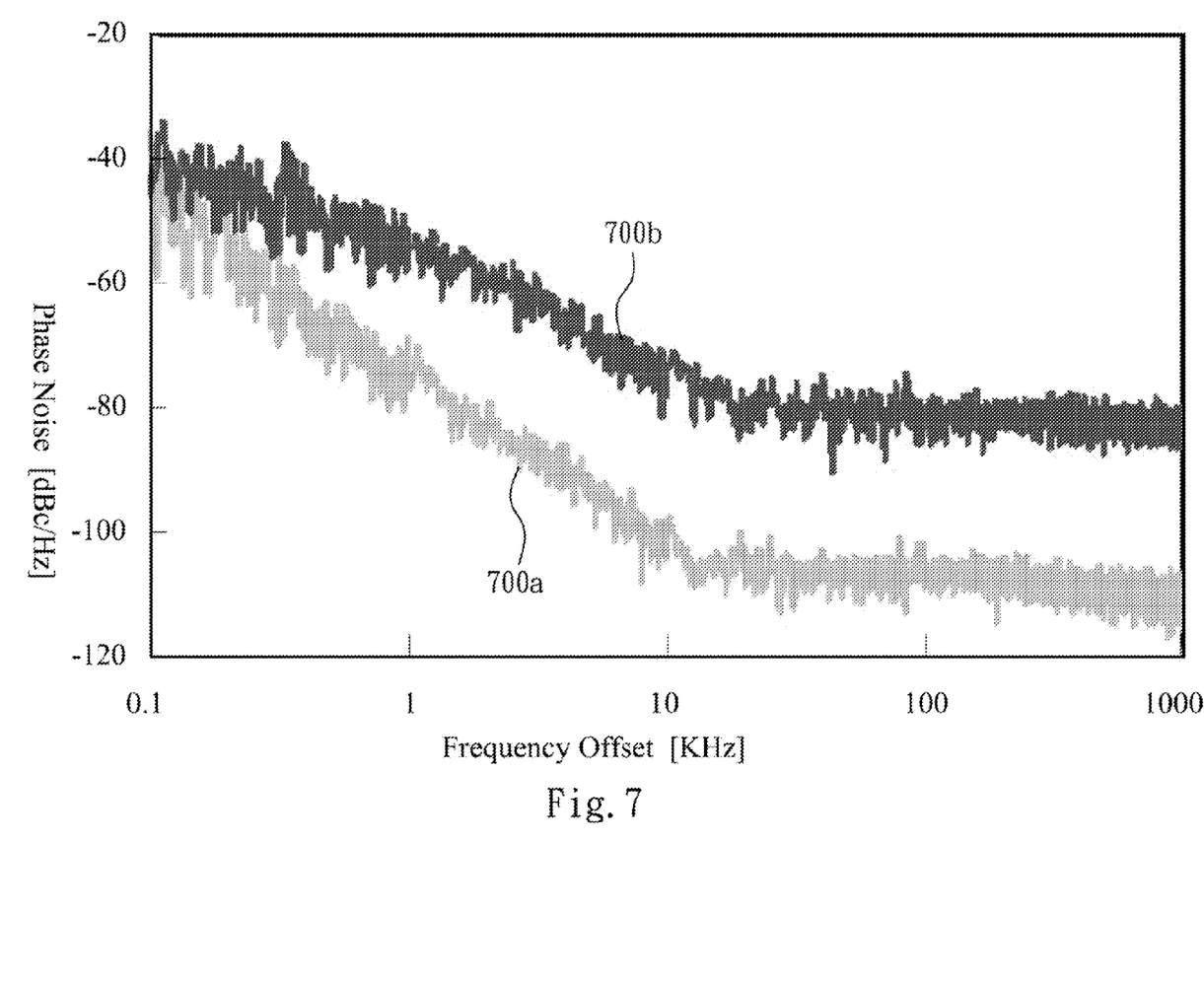
FIG. 7 shows a comparison of phase noises between the driving method of the high equivalent stiffness area and the driving method of the low equivalent stiffness area of the oscillation unit.

Referring to FIG. 7, FIG. 7 shows a comparison of phase noises between the driving method of the high equivalent stiffness area and the driving method of the low equivalent stiffness area of the oscillation unit 119 The measurement method described in FIG. 6 is applied to the electrode layouts of a micromechanical resonator oscillator in FIG. 3A and FIG. 3B, and the phase noises are compared. It is found that the phase noise 700a of the driving method of the high equivalent stiffness of the oscillation unit 119 is 26.3 dB lower than the phase noise 700b of the driving method of the low equivalent stiffness area of the oscillation unit 119.

Figure 8:
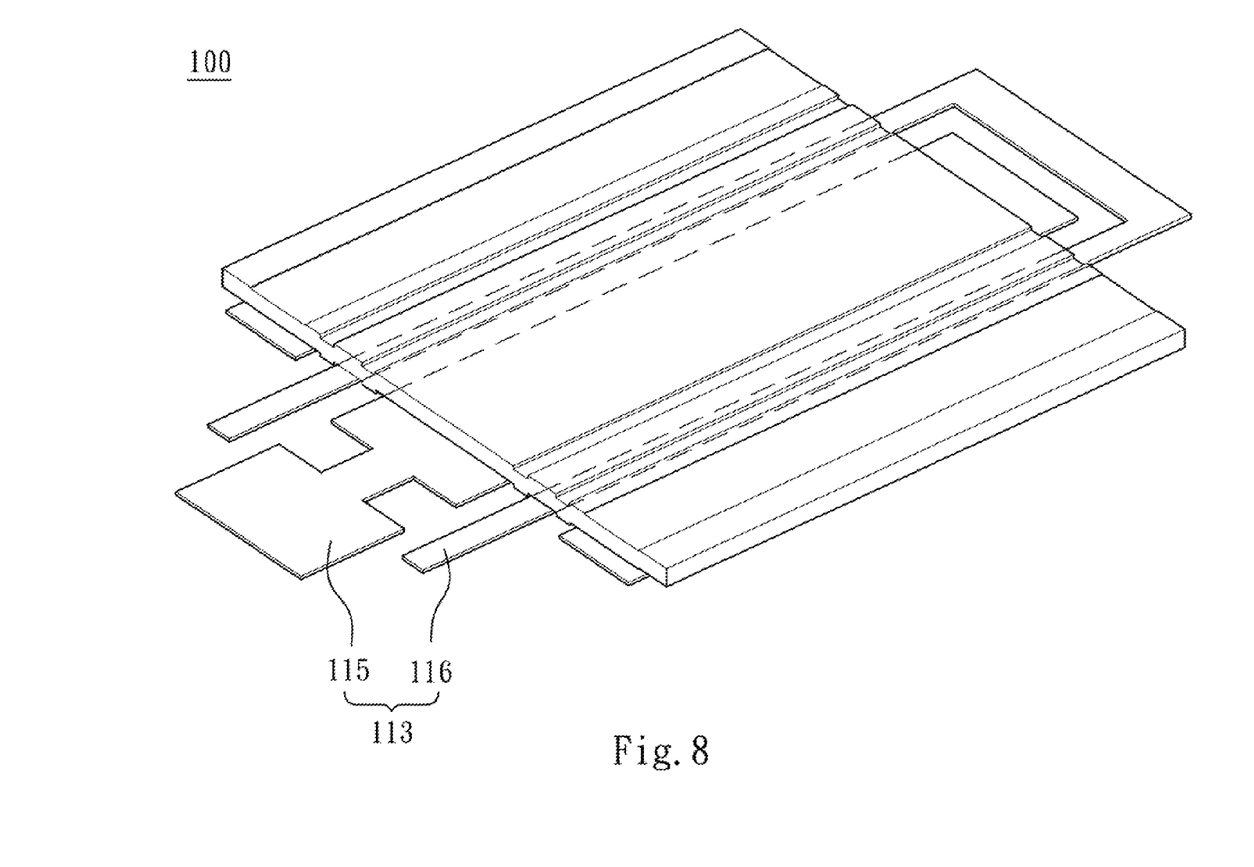
FIG. 8 is a schematic diagram showing one structure of the micromechanical resonator oscillator.

Referring to FIG. 8, one structure of the micromechanical resonator oscillator 100 is a beam type structure, and the electrode set 113 has one electrode set.

Figure 9:
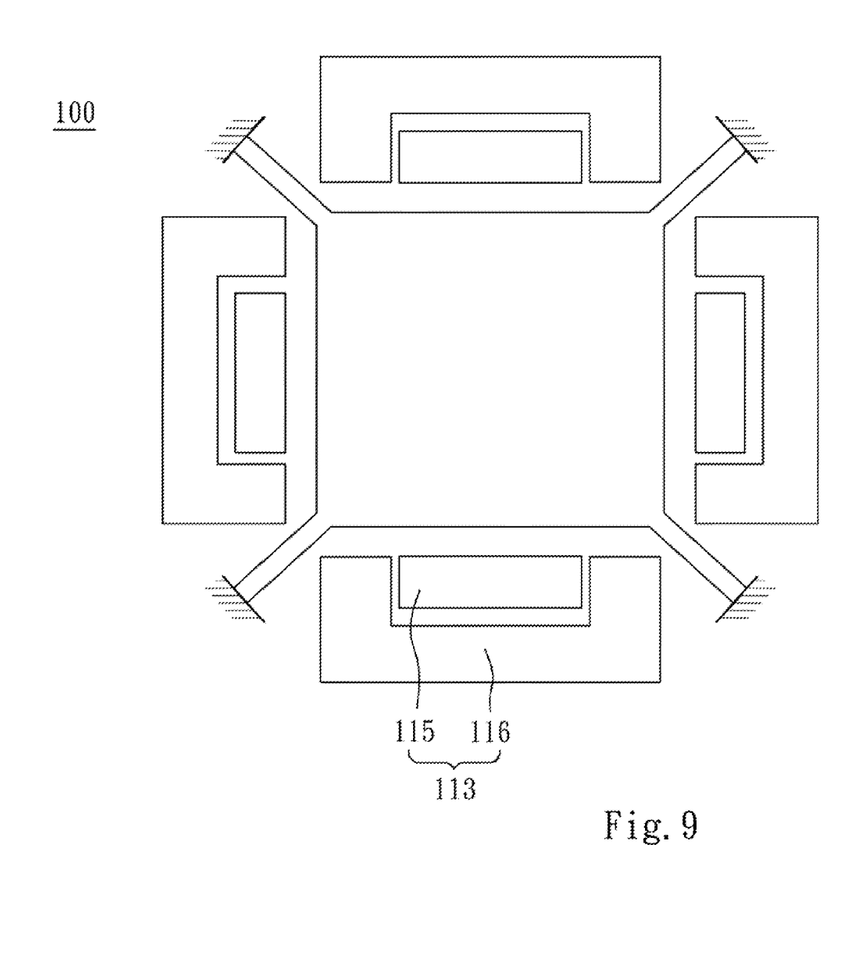
FIG. 9 is a schematic diagram showing another structure of the micromechanical resonator oscillator.
Figure 10:
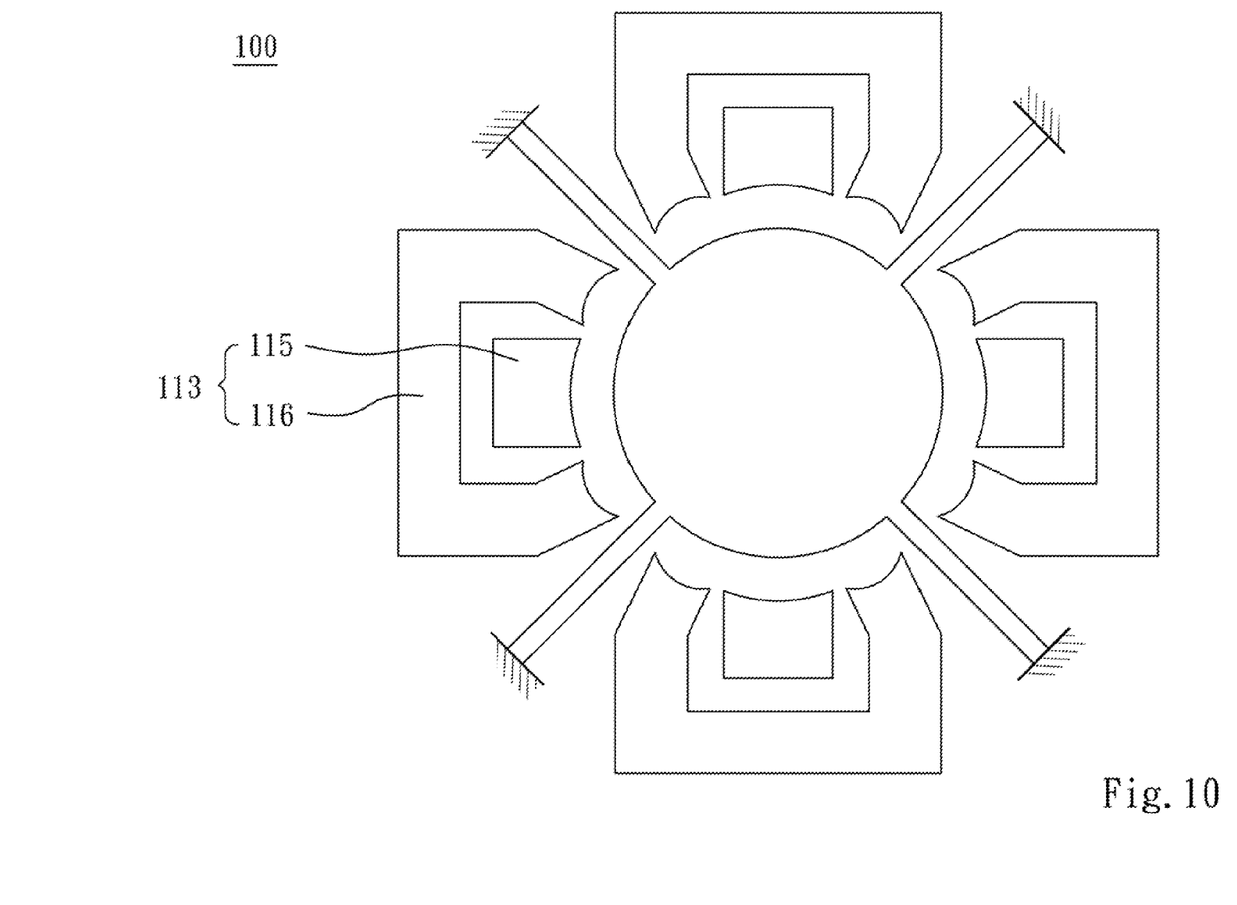
FIG. 10 is a schematic diagram showing another structure of the micromechanical resonator oscillator.

Referring to FIG. 9, another structure of the micromechanical resonator oscillator 100 is a square type structure, and the electrode set 113 has four sets of electrodes, Referring to FIG. 10, another structure of the micromechanical resonator oscillator 100 is a disc type structure, and the electrode set 113 has four sets of electrodes.

Figure 11:
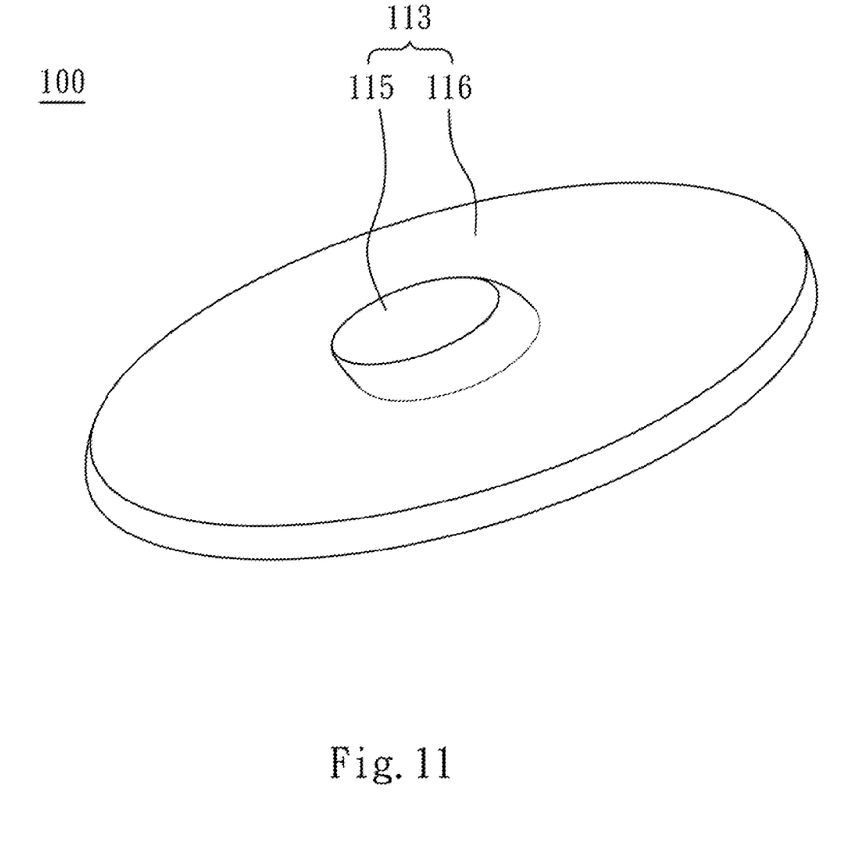
FIG. 11 is a schematic diagram showing another structure of the micromechanical resonator oscillator.

Referring to FIG. 11, another structure of the micromechanical resonator oscillator 100 is a disc type structure, and the electrode set 113 has one electrode set.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A micro mechanical resonator oscillator structure, comprising:
   a substrate;
   an insulating layer deposited on the substrate;

a conductive layer deposited on the insulating layer, the conductive layer comprising:

an electrode set; and an input contact;

an oscillation unit having a high equivalent stiffness area and a low equivalent stiffness area; and a plurality of anchor points, at least one of the anchor points connecting the oscillation unit to the input contact, the anchor points supporting the oscillation unit on the substrate;

wherein the electrode set is an expansion of two electrodes which are disposed under the high equivalent stiffness area and the low equivalent stiffness area of the oscillation unit, and one set of the electrodes is a driving electrode and the other set of the electrodes is a sensing electrode, and wherein the driving electrode is disposed under the high equivalent stiffness area and the sensing electrode is disposed under the low equivalent stiffness area; a phase noise of the micro mechanical resonator oscillator structure is lower and a spectrum stability of the micro mechanical resonator oscillator structure is higher than the situation that the driving electrode is disposed under the low equivalent stiffness area and the sensing electrode is disposed under the high equivalent stiffness area.

2. The micro mechanical resonator oscillator structure of claim 1, wherein a gap is formed between the oscillation unit and the electrode set.

3. The micro mechanical resonator oscillator structure of claim 1, wherein the oscillation unit is made of polycrystalline silicon.

4. The micro mechanical resonator oscillator structure of claim 1, wherein the electrode set and the input contact are formed from the conductive layer by using a photolithography process.

5. The micro mechanical resonator oscillator structure of claim 1, wherein the input contact is connected to the oscillation unit for enlarging a signal and tuning the frequency issued from the oscillation unit.

6. The micro mechanical resonator oscillator structure of claim 1, wherein the anchor points are formed by using a photolithography process.

7. The micro mechanical resonator oscillator structure of claim 1, wherein a layout of the two electrodes is symmetrical.

8. The micro mechanical resonator oscillator structure of claim 1, wherein the micro electro-mechanical resonator oscillator structure is formed in a beam, a square or a disc type structure.

9. The micro mechanical resonator oscillator structure of claim 1, wherein the electrode set has one, two or more sets of electrodes.

10. A driving method applicable to a micro mechanical resonator oscillator structure of claim 1, the driving method comprising:

inputting an input electronic signal to a driving electrode of the micro mechanical resonator oscillator structure; and outputting an output electronic signal from a sensing electrode of the micro mechanical resonator oscillator structure, and passing the output electronic signal through a number of electronic components.

11. A driving method of claim 10, wherein the electronic components comprise a transimpedance amplifier, a variable-gain amplifier, a loop buffer and an output buffer.

\* \* \* \* \*